(12) United States Patent
Luo et al.

(10) Patent No.: US 8,343,795 B2
(45) Date of Patent: Jan. 1, 2013

(54) METHOD TO BREAK AND ASSEMBLE SOLAR CELLS

(75) Inventors: Yuhao Luo, San Jose, CA (US);
Zhi-min Ling, Cupertino, CA (US)

(73) Assignees: Yuhao Luo, San Jose, CA (US);
Zhi-min Ling, Cupertino, CA (US)

( * ) Notice: Subject to any disclaimer, the term of this patent is extended or adjusted under 35 U.S.C. 154(b) by 0 days.

(21) Appl. No.: 12/877,953

(22) Filed: Sep. 8, 2010

(65) Prior Publication Data

US 2011/0065226 A1 Mar. 17, 2011

Related U.S. Application Data

(60) Provisional application No. 61/276,386, filed on Sep. 12, 2009, provisional application No. 61/276,387, filed on Sep. 12, 2009.

(51) Int. Cl.
*H01L 21/00* (2006.01)
*H01L 25/00* (2006.01)
*B23Q 3/00* (2006.01)

(52) U.S. Cl. ............. 438/67; 438/68; 269/296; 136/243

(58) Field of Classification Search ............ 438/60–65, 438/67, 68, 455–460, 461, 462; 269/296; 257/E21.237, E21.238; 136/243–265
See application file for complete search history.

(56) References Cited

U.S. PATENT DOCUMENTS

| | | | | | |
|---|---|---|---|---|---|
| 4,626,613 | A | * | 12/1986 | Wenham et al. | 136/255 |
| 5,527,744 | A | * | 6/1996 | Mignardi et al. | 216/2 |
| 6,232,545 | B1 | * | 5/2001 | Samaras et al. | 136/253 |
| 7,388,146 | B2 | * | 6/2008 | Fraas et al. | 136/246 |
| 2002/0056473 | A1 | * | 5/2002 | Chandra et al. | 136/256 |
| 2007/0295381 | A1 | * | 12/2007 | Fujii et al. | 136/244 |
| 2008/0203965 | A1 | * | 8/2008 | Katoh et al. | 320/101 |
| 2008/0235949 | A1 | * | 10/2008 | Gibson et al. | 29/890.033 |
| 2008/0264465 | A1 | * | 10/2008 | Kerr et al. | 136/244 |

* cited by examiner

*Primary Examiner* — Kiesha Bryant
*Assistant Examiner* — Dmitriy Yemelyanov
(74) *Attorney, Agent, or Firm* — Jingming Cai; Schein & Cai LLP (57) ABSTRACT

The present disclosure relates generally to a method to break and assemble solar cells to make solar panel. The present disclosure provides a method to produce solar pieces from solar cell, as well as assemble them together. The present disclosure device is unique when compared with other known devices and solutions because the present disclosure provides a high speed method to break scribed cells into pieces. A method of forming a string of solar cells includes providing a scribe line on a solar cell and placing a first ribbon on the solar cell. The method then includes placing the solar cell on a supporter and then breaking the solar cell into a plurality of solar cell pieces. The method then has the step of placing a second ribbon on the solar cell pieces and soldering the first and second ribbons and the solar cell pieces and then assembling the solar cell pieces into a string of solar cells.

9 Claims, 13 Drawing Sheets

METHOD TO BREAK AND ASSEMBLE SOLAR CELLS

CROSS REFERENCE TO RELATED PATENT APPLICATIONS

The instant patent application claims priority to U.S. Provisional Patent Application No. 61/276,386 to Luo et al. filed on Sep. 12, 2009, and which is herein incorporated by reference in its entirety and claims priority to U.S. Provisional Patent Application No. 61/276,387 to Luo et al., which has common inventors and filed on Sep. 12, 2009, and which is also herein incorporated by reference in its entirety.

BACKGROUND OF THE INVENTION

1. Field of the Invention

The present disclosure relates generally to a method to break and assemble solar cells to make solar panel from a number of solar cell pieces.

2. Background of the Invention

Standard industrial solar cells are square or pseudo-square. A solar cell is cut into smaller pieces for some applications. These may include a high voltage solar panel, or a low concentration solar panel. A plurality of pieces are electrically connected together to form solar panel. These include manufacturing steps including soldering ribbon connectors to a plurality of cells. As solar cell is very fragile and expensive, the process of breaking and assembling is challenging.

It would be desirable to have a method to break solar cell into pieces at a high throughput. It would be desirable to have method to break solar cell into pieces at a high yield. It would be desirable to have method to make simple and cheap equipment to produce solar pieces. Furthermore, it would be desirable to have method to assemble solar cell pieces at a high throughput. Still further, it would be desirable to have method to assemble solar cell pieces at a high yield Still further, it would be desirable to have method to make simple and cheap manufacturing equipment to assemble a number of solar pieces. Therefore, there currently exists a need in the industry for manufacturing devices and associated manufacturing methods to break solar cell into pieces or component parts.

SUMMARY OF THE INVENTION

The present disclosure advantageously fills the aforementioned deficiencies by providing a method to produce solar pieces from a solar cell, as well as assemble the solar pieces together. The present disclosure device is unique when compared with other known devices and solutions because the present disclosure provides: a high speed method to break the scribed cells into pieces. The present disclosure uses a supporter to introduce a trench beneath the scribe lines, which helps to break the solar cell. The present disclosure also uses a pusher or a roller to beak the solar cell. The present disclosure also uses pushing and rolling forces around the scribe lines to break the solar cell. The solar cell also uses a supporter with a pattern. The present disclosure provides that the cell piece drops into a location by gravity after breaking. Then an insulator is applied between ribbons to form an assembled solar cell.

According to a first aspect there is provided a method of forming a string of solar cells comprising providing a scribe line on a solar cell and placing a first ribbon on the solar cell. The method then includes placing the solar cell on a supporter and then breaking the solar cell into a plurality of solar cell pieces. The method then has the step of placing a second ribbon on the solar cell pieces and soldering the first and second ribbons and the solar cell pieces and then assembling the solar cell pieces into a string of solar cells.

According to another aspect of the present disclosure there is provided a method of forming a string of solar cells comprising providing a scribe line on a solar cell and placing the solar cell on a supporter having a gap. The method then breaks the solar cell into a plurality of solar cell pieces by aligning the scribe line with the gap and then soldering a first and a second ribbons and the solar cell pieces. The method then assembles the solar cell pieces into a string of solar cells.

According to yet another aspect there is provided a method of forming a string of solar cells comprising providing a scribe line on a solar cell and placing the solar cell on a supporter comprising a first member and a plurality of protruding second members extending from the first member. The method then breaks the solar cell into a plurality of solar cell pieces using the protruding members and the scribe line or using a gap formed between at least two protruding members and the scribe line. The method then places at least one ribbon on the solar cell pieces and then solders the at least one ribbon and the solar cell pieces and then assembles the solar cell pieces into a string of solar cells.

According to another aspect of the present disclosure there is provided a supporter. The supporter is for breaking a solar cell at a high throughput. The supporter comprises a first supporter member and a plurality of protruding second members extending from the first member. The solar cell comprises a scribe line. The scribe line is placed on the second members and broken into a plurality of solar cell pieces using the protruding members and the scribe line or broken using a gap formed between at least two protruding members and the scribe line.

According to yet another aspect of the present disclosure there is provided a method of forming a string of solar cells comprising breaking a solar cell comprising a body with a scribe line. The solar cell is placed on a plurality of protruding members and the solar cell being broken into a plurality of solar cell pieces with the breaking of the solar cell using the protruding members and the scribe line or breaking the solar cell comprising the body with the scribe line with the breaking being accomplished by placing the scribe line on a gap formed between at least two protruding members and using the gap formed between at least two protruding members and the scribe line.

BRIEF DESCRIPTION OF THE FIGURES

The foregoing and other objects, features and advantages of the invention will be apparent from the following more particular description of preferred embodiments of the invention, as illustrated in the accompanying drawings in which like reference characters refer to the same parts throughout different views. The drawings are not meant to limit the invention to particular mechanisms for carrying out the invention in practice, but rather, the drawings are illustrative of certain ways of performing the invention. Others will be readily apparent to those skilled in the art.

DETAILED DESCRIPTION OF THE INVENTION

The present disclosure is directed to a method to separate a solar cell into solar cell pieces and assemble the pieces into a component. The present disclosure includes devices to break solar cell and devices to form an assembly, which includes, but not limited to following devices: a) scriber or a device to cut scribe lines into the solar cell, b) a supporter to support the solar cell and to separate the solar cell into pieces, c) a bus bar pattern maker, and d) a pusher or roller, The present disclosure includes a process to break solar cell and to form an assembly, which includes following processes, but not limited to: a) a process to scribe the solar cell, such as saw dicing, and laser dicing. The scribe is normally from the back of the cell and is a cut located partially through the cell. The process also has the steps of a) a process to make a supporter with a trench pattern matches the scribe lines, b) a process to make a supporter with a trench that matches the width of the cell unit, c) a process to move a scribed cell onto a supporter and with scribe line facing a trench in the supporter and d) a process to align the cell to the supporter so that the scribe is aligned to the trench in the supporter, and e) a process make a ribbon patterned to match the holder and f) a process to break the solar cell into the pieces. The process also has steps g) a process to place cell pieces into ribbons, h) a process to assemble solar cell unit with the ribbons, i) a process to introduce an insulator between the top and the bottom ribbons and j) a process to solder the cell and the ribbons together.

Examples related to the present disclosure are shown. In the following description, numerous specific details are set forth in order to provide a thorough understanding of the present disclosure. However, to one having ordinary skill in the art, it will be apparent that the specific detail need not be employed to practice the present disclosure. Well known methods related to the implementation are not described in detail in order to obscuring the present disclosure.

Figure 1:
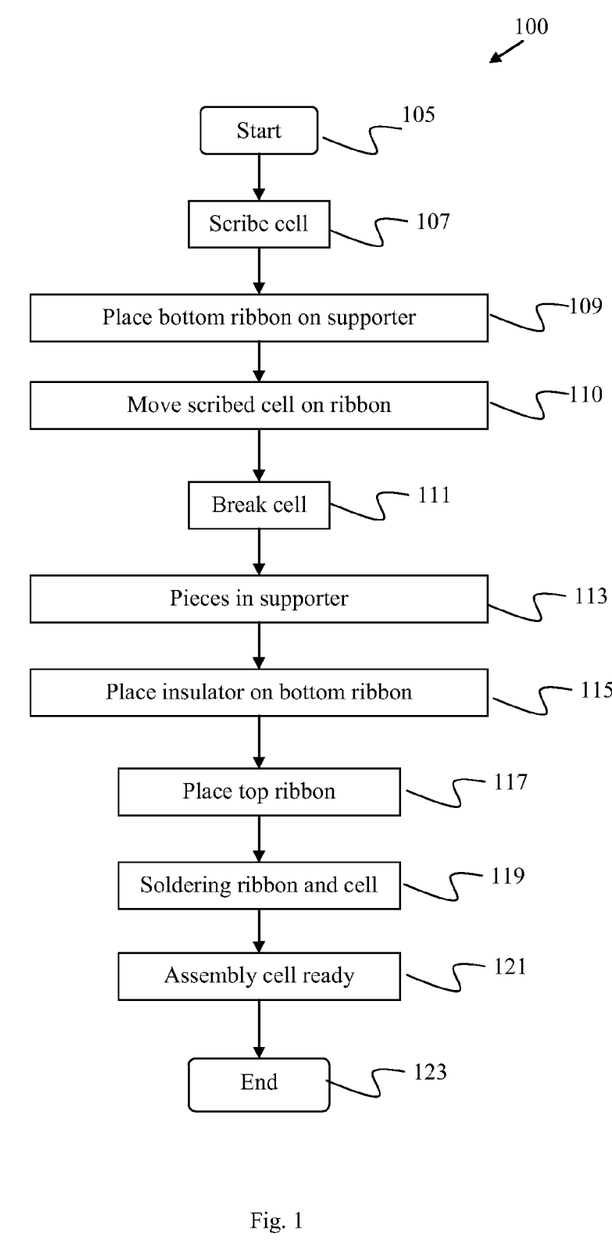
FIG. 1 shows a flow chart of an embodiment of the present disclosure to break a solar cell and form an assembly cell.

FIG. 1 shows a flow chart of an embodiment of the present disclosure to break solar cell and form assembly generally shown as reference numeral 100 and steps 105 to 123. The method starts at step 105 and then the solar cell is scribed from the back side of the cell at step 107. This may be scribed perpendicular to the bus bars. The bottom ribbons are placed on a supporter at step 109. The placement is made with a location matching the bus bar on the cell. The scribed cell is placed on top of bottom ribbons (step 110) and the scribed cell or cell with the scribe lines is then placed on a supporter with the scribe lines facing the supporter. By using force around the scribe lines, then the cell is broken at step 111 and the cell pieces drop into the trenches of the supporter at step 113. An insulator is then placed on the bottom ribbon between the cell pieces at step 115. Top ribbons are placed on the top at step 117, aligning to the front bus bar of the solar cell. Then cell pieces and the ribbons are soldered together to form an assembly cell (steps 119 and 121) and then the method 100 ends at step 100. Some steps 105-123 may be performed in a different order or simultaneously and the method 100 is not limited to the embodiment shown in FIG. 1.

Figure 2A:
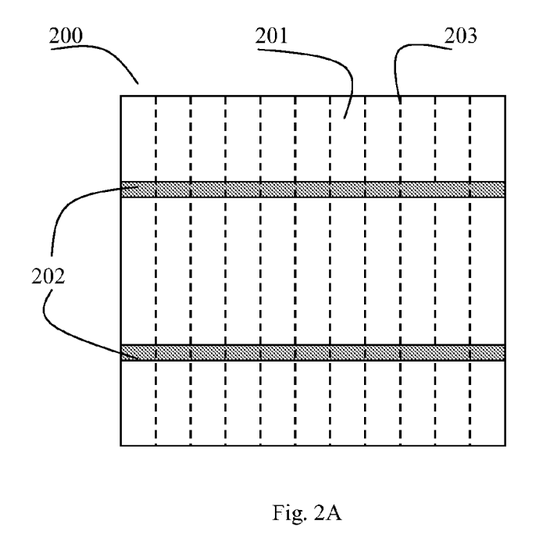
FIG. 2A shows a top view of solar cell with scribe lines on the backside with the scribe lines being accomplished by a saw, a laser, a water jet, etc.
Figure 2B:
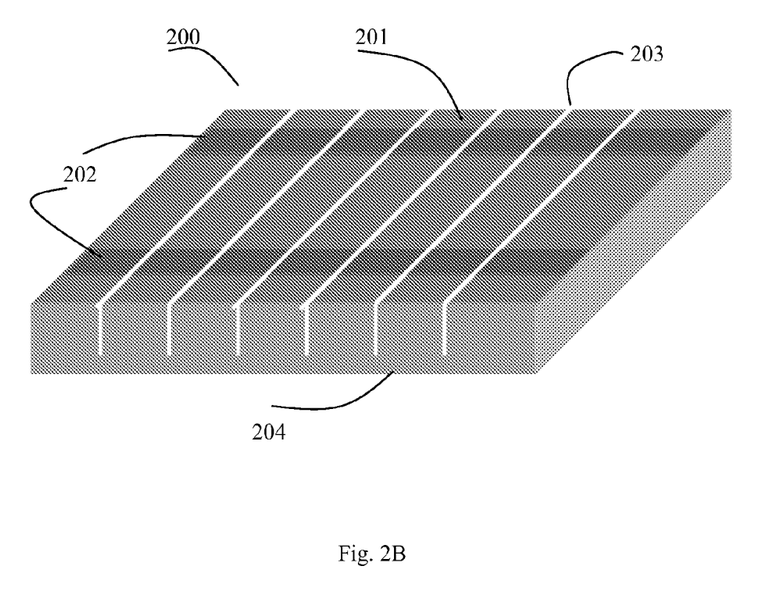
FIG. 2B shows a simplified cross section of a solar cell with the scribe lines on the backside.

FIG. 2A shows a top view of a solar cell 200 with a number of scribe lines 203 on the backside. The scribe lines 203 can be accomplished by various methods. These may be accomplished by saw, laser, water jet, etc. or any method known in the art. A solar cell 200 is scribed on the backside 201, and preferably made perpendicularly to the backside bus bar 202. The scribe line 203 is partially made through the solar cell 200. FIG. 2B shows a simplified cross section of a scribed solar cell 200 shown in FIG. 2A.

Figure 3A:
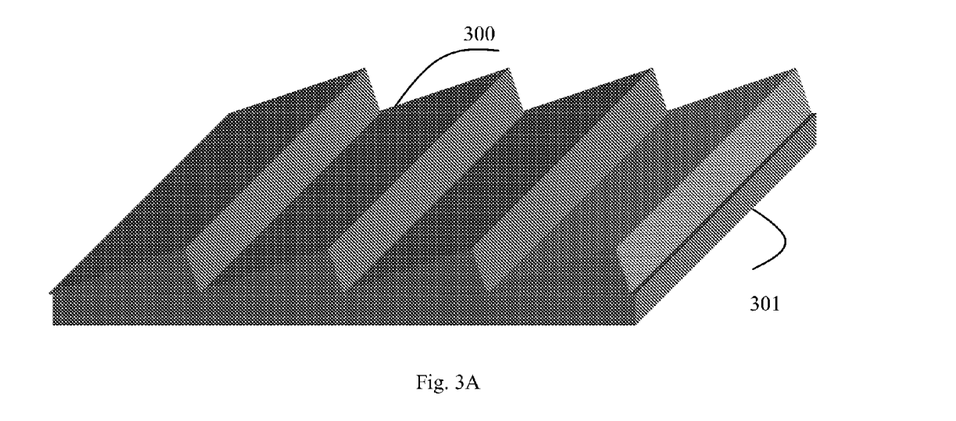
FIG. 3A shows the simplified side view of a sample of supporter that has trenches, which are parallel to the scribe lines and spaced by the same width as the cell pieces between the scribe lines.

FIG. 3A shows the simplified side view of a sample supporter 301 for supporting the solar cell 200. The supporter 301 is for breaking a solar cell at a high throughput. The supporter 301 includes two parts or a first supporter member and a plurality of protruding second members extending from the first member. The protruding second members are a number of triangular shaped steps that form trenches 300. The solar cell 200 having a scribe line 203 is placed on the second members and broken into a plurality of solar cell pieces using the protruding members and the scribe line 203 or broken using a gap formed between at least two protruding members and the scribe line 203.

Figure 3B:
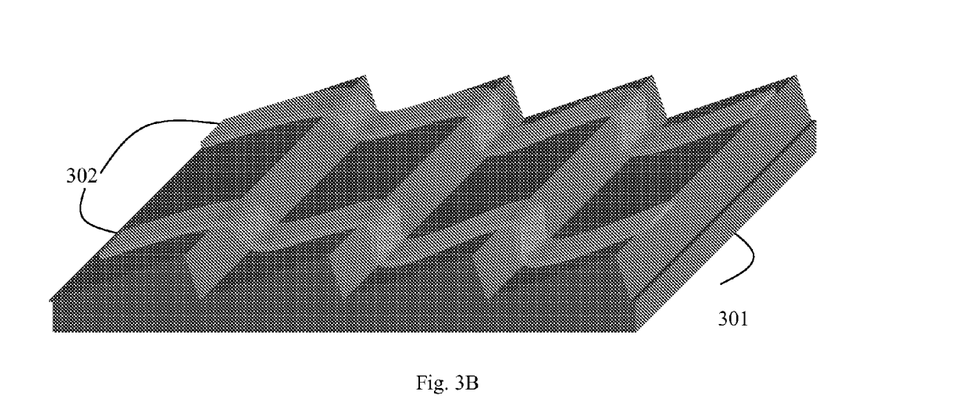
FIG. 3B shows a simplified side view of a supporter with back ribbons that are patterned and that are placed on a top side with the locations of the back ribbons matching bus bars on the solar cells.

The supporter 301 has a number of trenches 300, which are parallel to the scribe lines 203 and which are spaced the same as the scribe lines 203 on a solar cell 200 in a complementary fashion. FIG. 3B shows the simplified side view of a supporter 300 and the back ribbons 302 being patterned and placed on top of the supporter 300. A back ribbon 302 is patterned to match with the trenches 300 of the supporter 301. The number of the back ribbons 302 are placed on the top of the supporter 301. The number of the back ribbons 302 match the location of the bottom bus bar 202 of the solar cell 200.

Figure 3C:
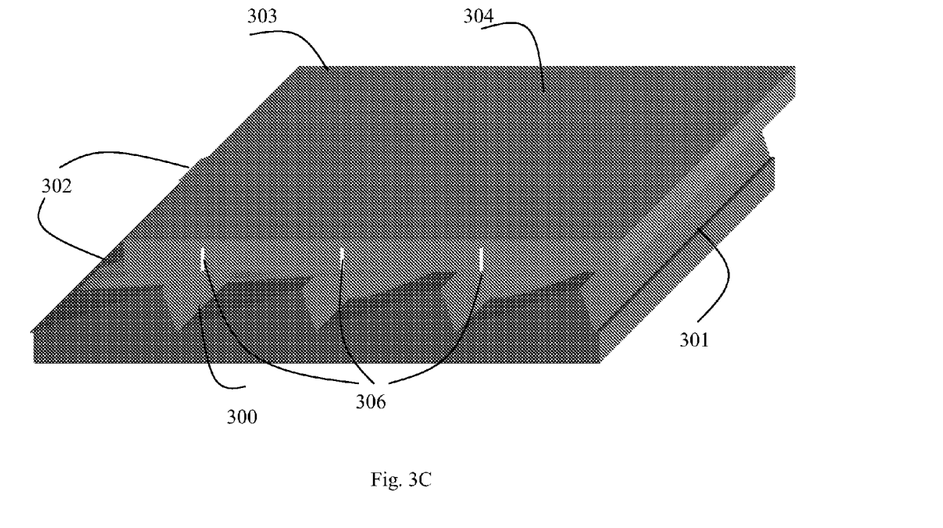
FIG. 3C shows the simplified side view of placing a scribe lined solar cell on the supporter and the bottom ribbons with the scribe lines facing down toward the supporter where the scribe lines are on the top of trenches and the bus bars of solar cell align with the bottom ribbons.

FIG. 3C shows the simplified side view of placing a scribed or cut solar cell 303 on the supporter 301 and a view of the bottom ribbons 302. A scribe solar cell 303 is moved onto a top of the bottom ribbons 302 and the supporter 301. The configuration has the scribe lines 306 facing downward in a position located generally toward the supporter 301. The front side 304 of the solar cell 303 faces upwardly. The scribe lines 306 are on the top of the trenches 300. The backside bus bars 202 of the solar cell generally align with the bottom ribbons 302.

Figure 3D:
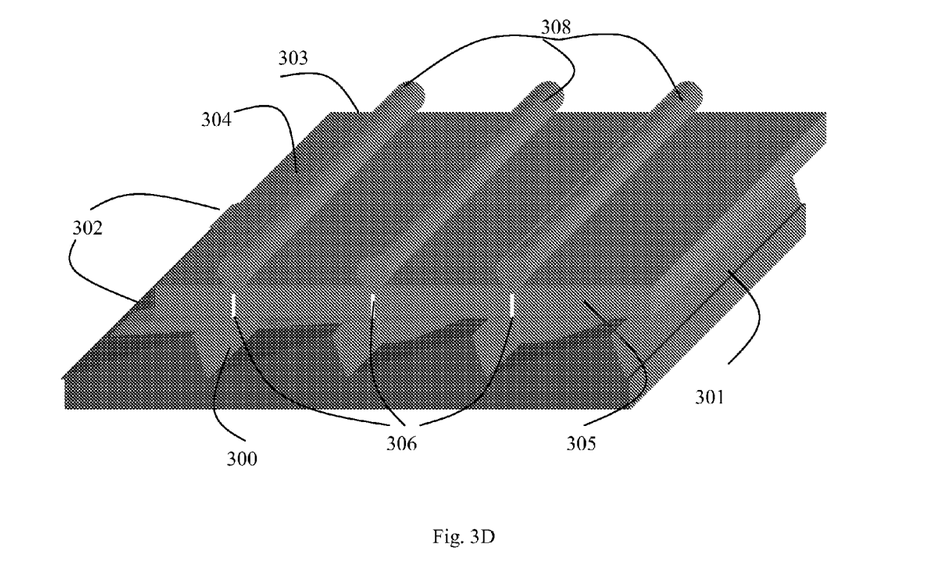
FIG. 3D shows the simplified side view of an embodiment of using a pusher to break the solar cell with the pusher having multiple roller bars being aligned with scribe lines and spaced the same with the pusher being pushed on the cell and moved left and right to have roller bars to roll around scribe lines to break the cell.

FIG. 3D shows the simplified side view of an embodiment of using a pusher with roll bars 308 to break the solar cell 303. The pusher has multiple roller bars 308 being aligned with scribe lines 306. The roller bars 308 impart a downward force on the solar cell 302 and then are moved generally left and right around the scribe lines 306 to break the cell 303 into cell pieces 305 as shown by reference arrow A.

Figure 3E:
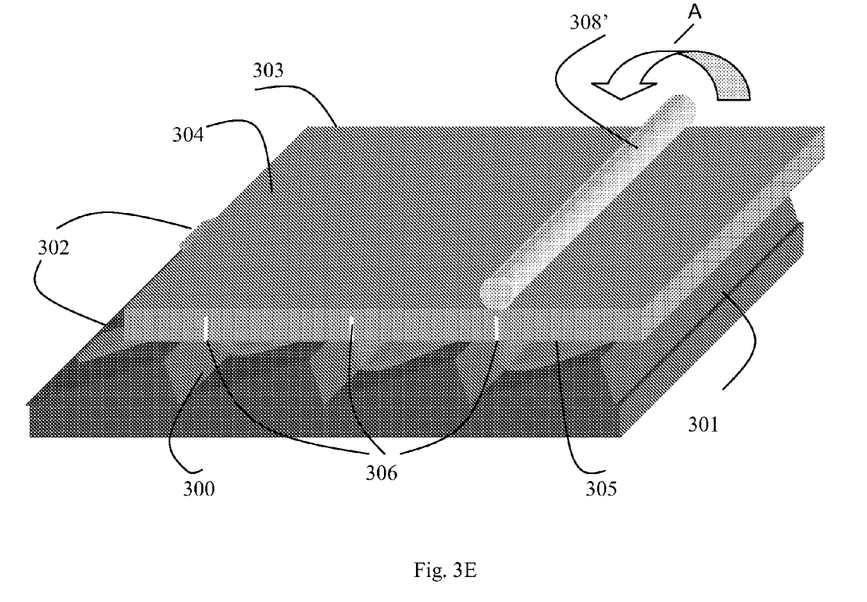
FIG. 3E shows the simplified side view of another embodiment of using a roller to break the solar cell with the roller having a roller bar being aligned with scribe lines and with the roller being rolled from one edge of the cell to the other edge and generally perpendicular to the scribe lines.

FIG. 3E shows the simplified side view of another embodiment of using a roller 308 to break the solar cell 303. The roller 308 has one roller bar 308' aligned with scribe lines 306. The roller bar 308' is rolled from one edge of the solar cell 302 to the other edge of the solar cell 302 and is forced perpendicularly to the scribe lines 306 thus breaking cell 302 into the cell pieces 305 in an even manner. This can make the method of manufacturing the solar cell pieces having a faster throughput.

Figure 3F:
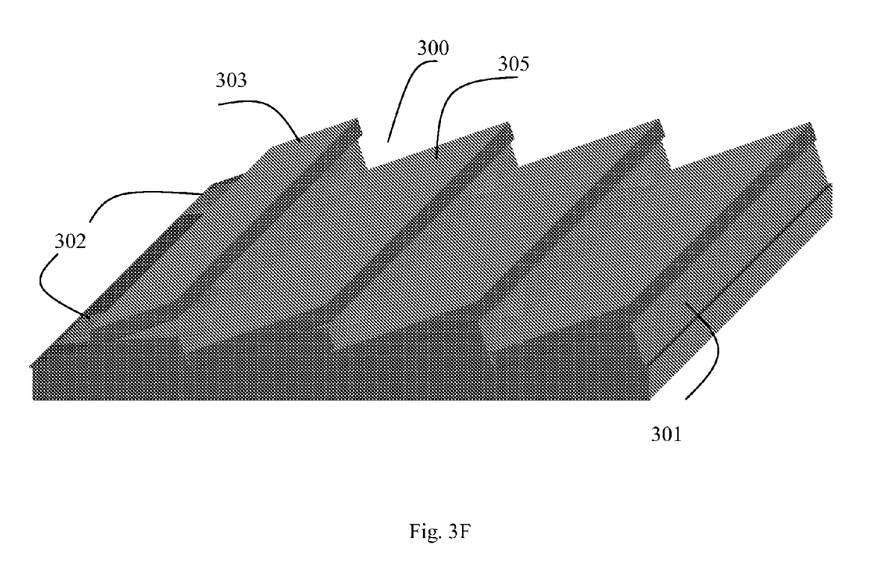
FIG. 3F shows the simplified side view of an embodiment with broken solar cell with the supporter being designed so that cell piece drop in to the trench after break and the cell pieces align in parallel and touch the ribbon.

FIG. 3F shows the simplified side view of an embodiment with the broken solar cell 302 broken into the cell pieces 305 in an even manner. For this embodiment, the supporter 301 is designed so that the cell piece 305 drop in to the trench 300 after breaking the solar cell 303 into the cell pieces 305 in an even manner. The cell pieces 305 are aligned in parallel and sit in the trench 300 on the top of the bottom ribbons 302.

Figure 3G:
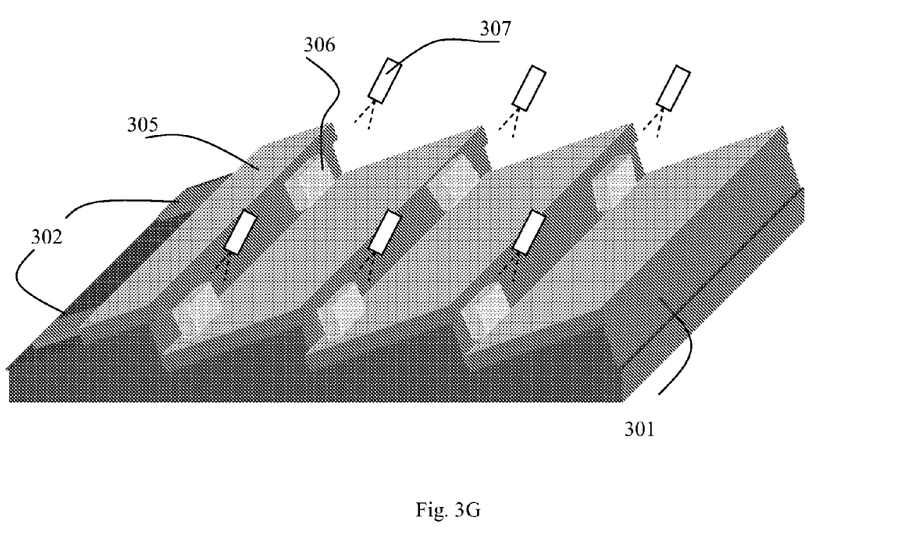
FIG. 3G shows the simplified side view of introducing insulator onto the bottom ribbon between the cell pieces.

FIG. 3G shows the simplified side view of introducing an insulator 307 onto the bottom ribbon 302 and between the cell pieces 305. As an embodiment, a liquid insulator 307 is sprayed by nozzles 307. The liquid insulator 307 is sprayed on to bottom bus bar 302 between the cell pieces 305 and then the liquid insulator 307 is dried or cured into a solid. The insulator 307 can be polymer materials, such as silicone, EVA or any other insulator known in the art. The drying or curing can be done by varying of process, such as heat, UV, IR or any other curing method known in the art. The drying or curing can be done after spraying, or during the soldering of the ribbons 302.

Figure 3H:
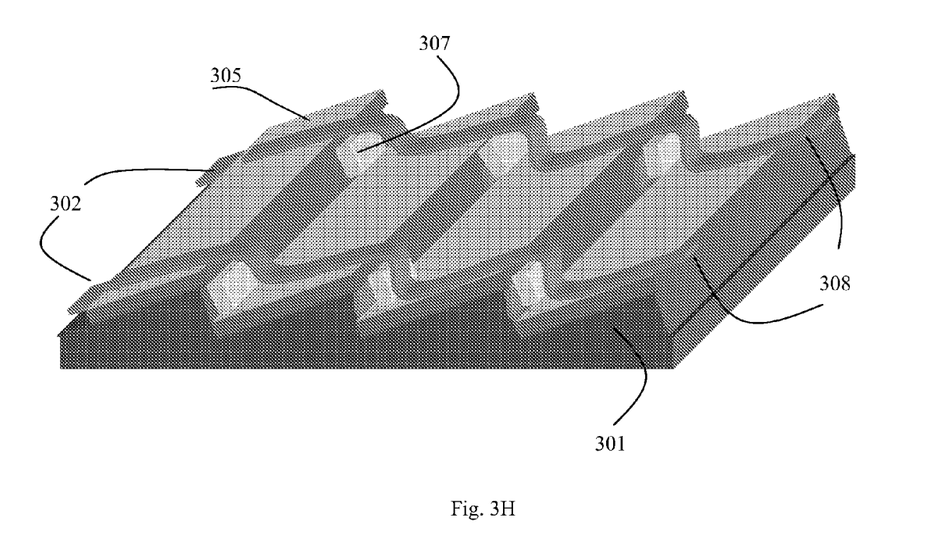
FIG. 3H shows the simplified side view of introducing top ribbons on to cell pieces and being aligned with the bus bars of solar cell pieces.

FIG. 3H shows the simplified side view of introducing a number of top ribbons 308 on to the cell pieces 305 being aligned with bus bars of the solar cell pieces. The top ribbons 308 are placed on top of cell pieces 305 and are aligned with the front bus bar of the cell pieces 305. The insulator 307 insulates a bottom ribbon 302 and a top ribbon 308. The cell pieces 305 and the bottom ribbon 302 and the top ribbon 308 are then all soldered together by various methods or means, such as hot bar soldering, infrared soldering, laser soldering or any soldering method known in the art.

Figure 4:
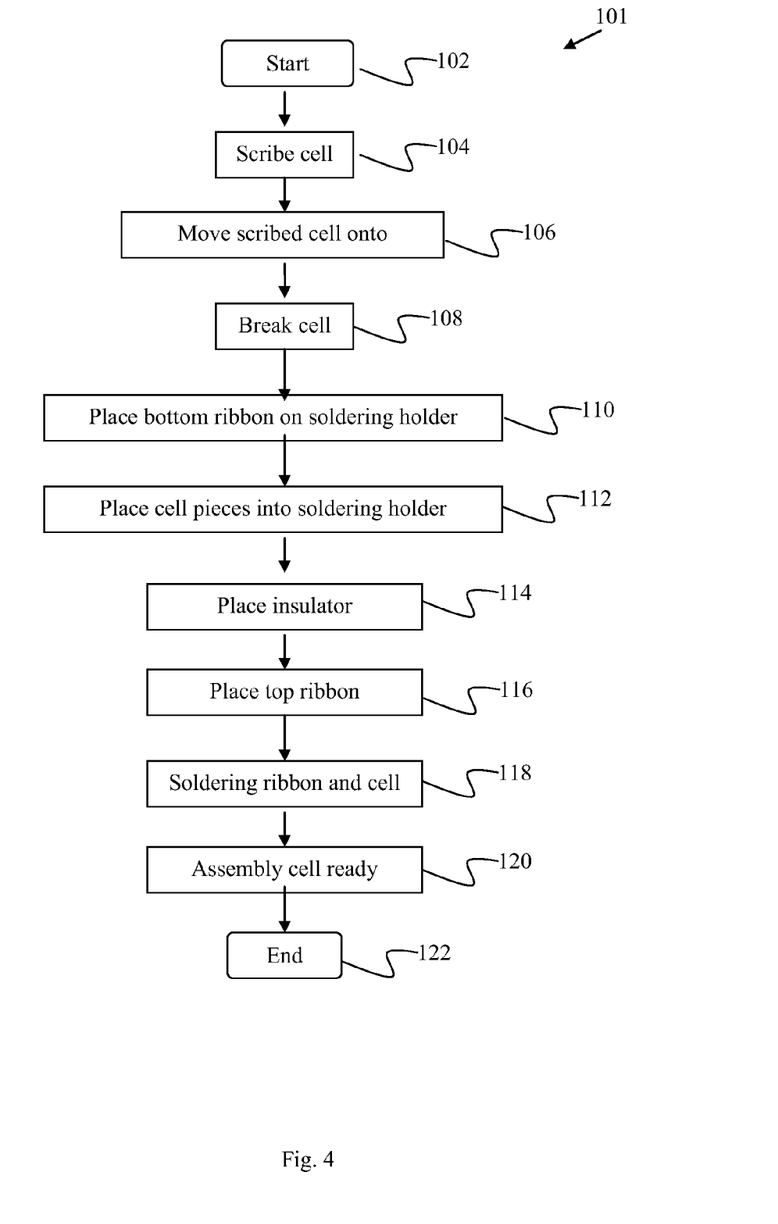
FIG. 4 shows a flow chart of another embodiment of the present disclosure to break a solar cell and form an assembly cell.

FIG. 4 shows a flow chart of another embodiment of the present disclosure to break solar cell and form an assembly generally shown as reference numeral 101. The method 101 starts at step 102 and passes to step 104. The solar cell is then scribed from the back side of the solar cell and generally perpendicular to the bus bars at step 104. The scribe cell is then placed on top of a supporter with the scribe lines facing the supporter (step 106). By using force around the scribe lines, the cell is then broken and cell pieces stay on top of supporter (step 108). The cell pieces are taken and placed onto the bottom ribbons on the soldering holder (step 110-112). An insulator is placed on the bottom ribbon between the cell pieces (step 114). Top ribbons are placed on the top side (step 116) and are aligned to the front bus bar of the solar cell. Then cell pieces and the ribbons are soldered together to form an assembly (steps 118-120). Some steps 105-123 may be performed in a different order or simultaneously and the method 100 is not limited to the embodiment shown in FIG. 4.

Figure 5A:
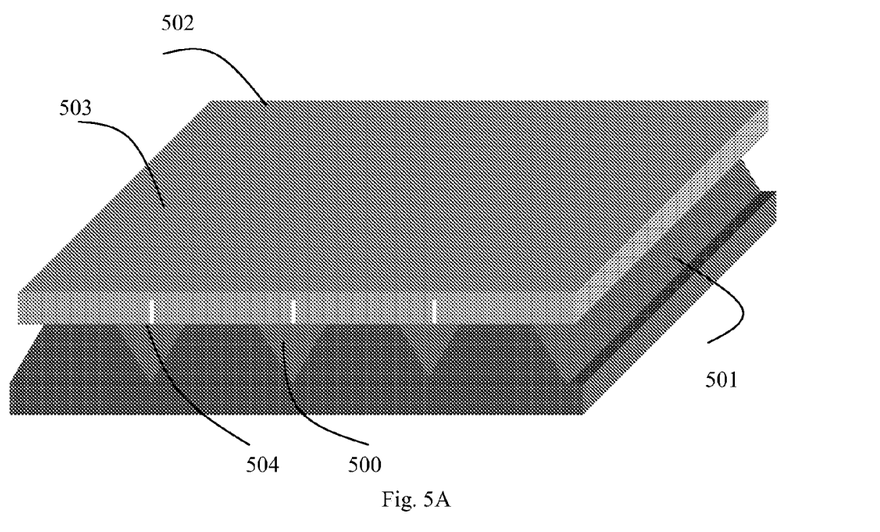
FIG. 5A shows the simplified side view of a supporter and a scribe cell on top with the supporter is designed to have small trenches and a flat support located beneath the cell piece and wherein the distance between the trenches is the same as that of scribe lines.

FIG. 5A shows the simplified side view of a supporter 501 having a scribe cell 502 on a top side thereof. A scribe cell 502 is then placed on the supporter 501 with a scribe line 504 facing the supporter on the trench 500. The supporter 501 has flat top, which is disposed underneath the cell piece 503. The supporter 501 is for breaking a solar cell at a high throughput. The supporter 501 includes two parts or a first supporter member and a plurality of protruding second members extending from the first member. The protruding second members are a number of triangular shaped steps that form trenches 500. The solar cell having a scribe line is placed on the second members and broken into a plurality of solar cell pieces using a gap or trench 500 formed between at least two protruding members and the scribe line.

Figure 5B:
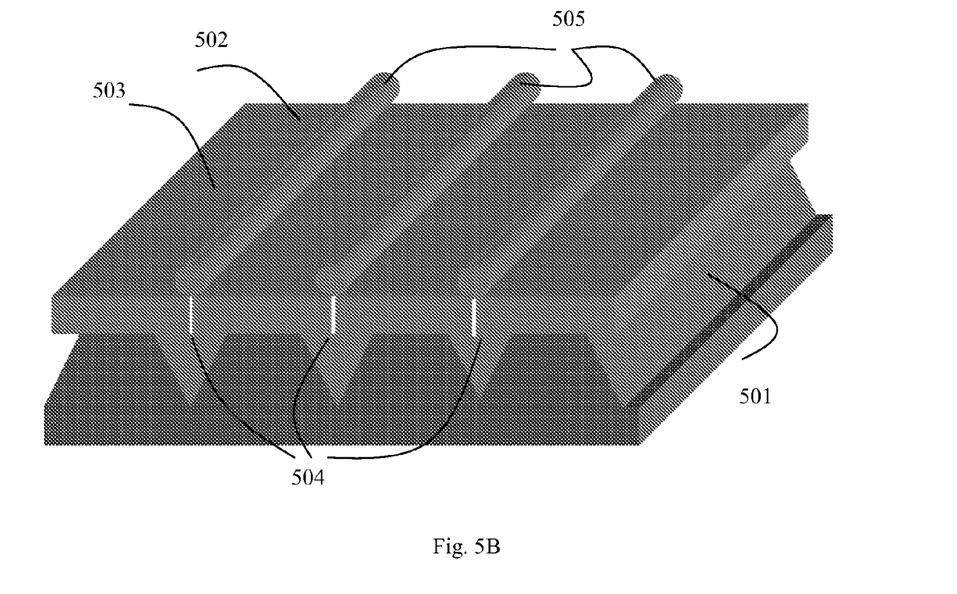
FIG. 5B shows the simplified side view of an embodiment of using a pusher to break the solar cell and after breaking, the cell becomes cell pieces sitting on top of the supporter.

FIG. 5B shows the simplified side view of an embodiment of using a pusher having roller bars 505 to break the solar cell. The pusher has multiple roller bars 505 being generally aligned with the scribe lines 504. The roller bars 505 impart a force on the cell 502. When the force is supplied to the roller bars 505 and when the roller bars 505 are moved left and right around the scribe lines 504 break the cell 502 into the cell pieces 503.

Figure 5C:
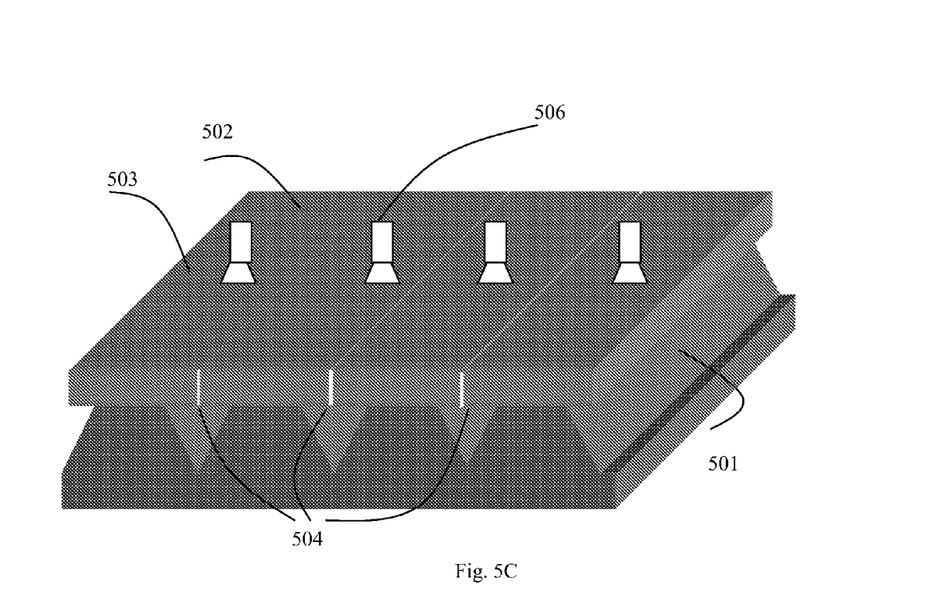
FIG. 5C shows the simplified side view of using vacuum cups to pick up cell pieces.
Figure 5D:
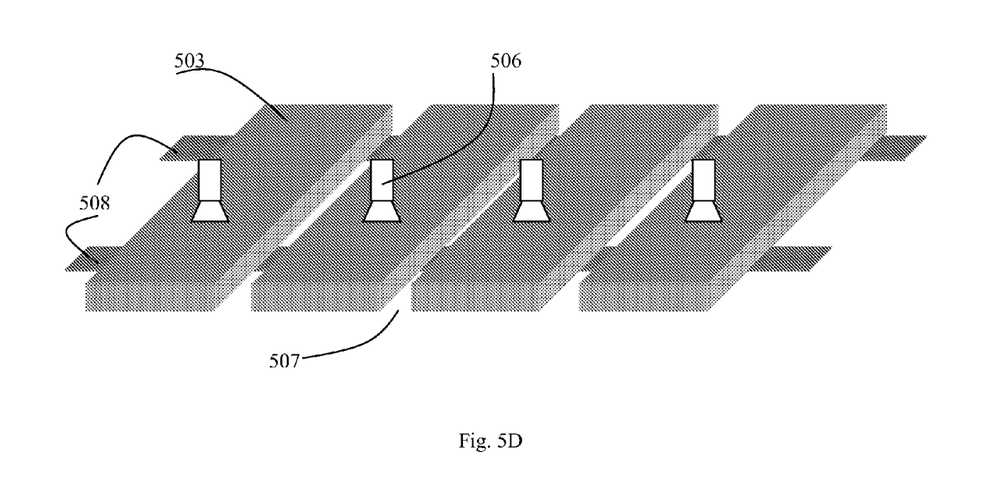
FIG. 5D shows the simplified side view of placing cell pieces onto bottom ribbons.

FIG. 5C shows the simplified side view of an embodiment of the moving of the cell pieces 503. For this example, a vacuum cup 506 holds a cell piece 503 from a top side and the vacuum cup 506 then grasps the cell piece 503 upwardly. FIG. 5D shows a simplified side view of placing the cell pieces 503 on a top and on a bottom of the ribbons. After picking up the cell pieces 503, the vacuum cups 506 move to separate cell pieces 503 from each other to leave a gap 507. Then vacuum cups 506 then place the cell pieces 503 onto the bottom ribbons 508. The bottom ribbons 508 are then placed to align with backside bus bar 507 of the cell pieces 503.

Figure 5E:
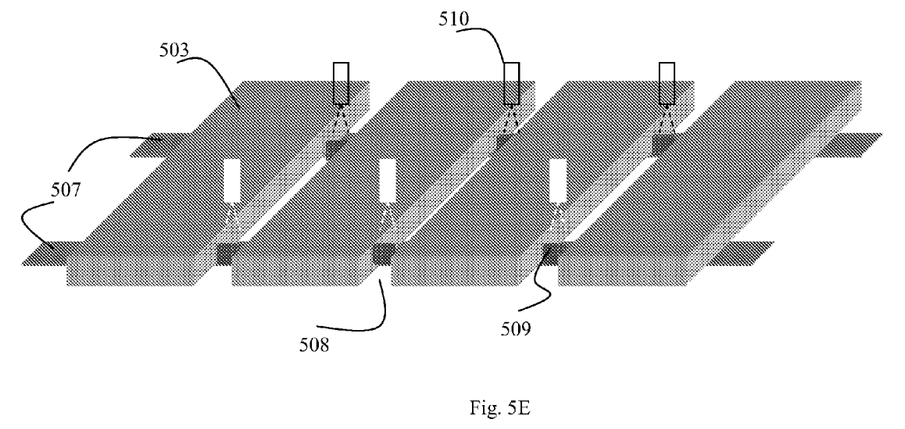
FIG. 5E shows the simplified side view of introducing insulator onto the bottom ribbon between cell pieces.

FIG. 5E shows the simplified side view of introducing an insulator 509 onto the bottom ribbon and generally between the cell pieces 503. As an embodiment, a liquid insulator 509 is sprayed by a number of nozzles 510 on to bottom bus bar 507. This is sprayed between the cell pieces 503 and then dried or cured into a solid. The insulator 509 can be a polymer material, such as silicone, EVA or any other insulator known in the art. The drying or curing can be done by various processes including heat, ultraviolet, infrared, or any other drying or curing method known in the art. The drying or curing can be done substantially immediately after spraying, or the drying or curing can be done during the soldering of the ribbons 507.

Figure 5F:
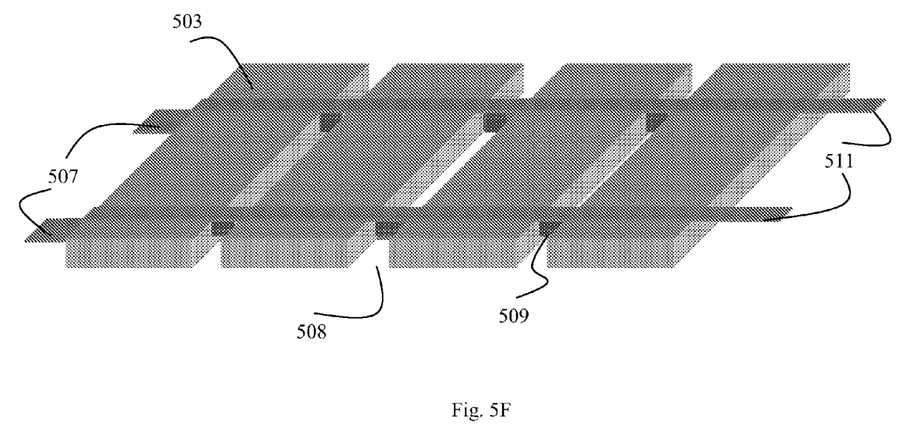
FIG. 5F shows the simplified side view of introducing top ribbons on to cell pieces aligned with the bus bars of solar cell pieces and the cell pieces and ribbons are soldered together.

FIG. 5F shows the simplified side view of introducing a number of top ribbons 511 on to cell pieces 503 that are aligned with the bus bars of the solar cell pieces 503. Top ribbons 511 are placed on a top of the cell pieces 503 and are aligned with the front bus bar of the cell pieces 503. The insulator 509 then insulates a bottom ribbon 507 and a top ribbon 511. The cell pieces 503 and the bottom ribbons 507 and the top ribbons 511 are then soldered together by various soldering methods including, such as hot bar, infrared, laser or any method known in the art.

Figure 6A:
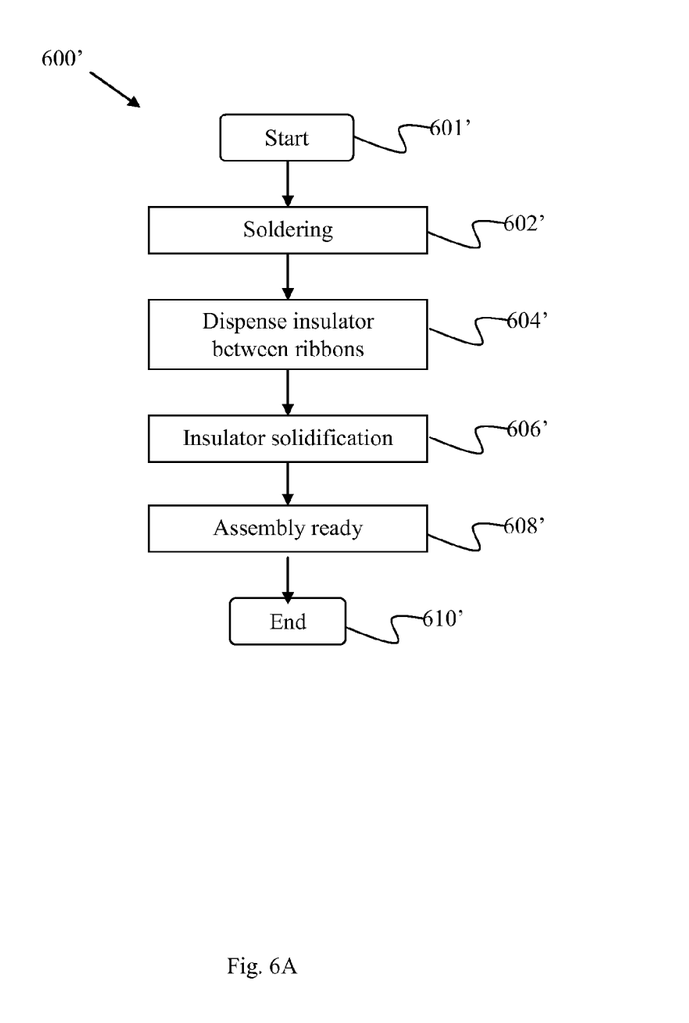
FIG. 6A shows a flow chart of another embodiment of the present disclosure to introduce the insulator between ribbons after the soldering of solar cell and ribbons.

The insulator is introduced before the placement of a top bus bar. As another option, the insulator can be introduced after the placement of a top bus bar and even the soldering of bus bar. FIG. 6A shows a flow chart of another embodiment of the present disclosure to introduce an insulator after the soldering of the bus bar. The method 600' commences at step 601' and passes to step 602' where soldering occurs. The liquid insulator is dispensed into the space between the ribbons and the cell pieces (step 604'). The insulator is the solidified at step 606' and then the assembly is made at step 608' and the method 600' ends at step 610'.

Figure 6B:
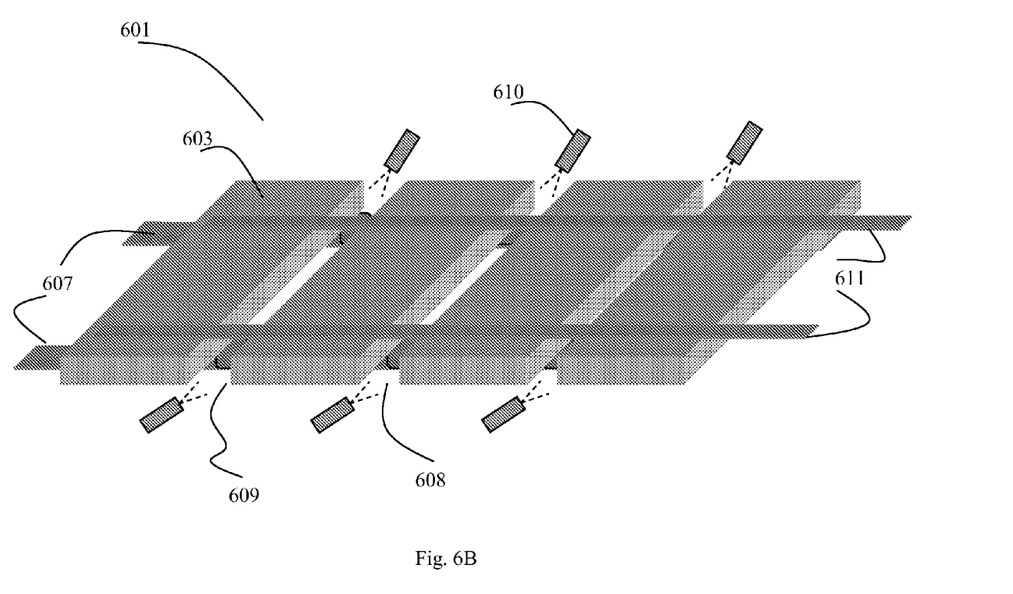
FIG. 6B shows the simplified side view of introducing insulator into space between the ribbons and cell pieces by spraying liquid insulator, which is then cured.

FIG. 6B shows a simplified side view of introducing an insulator 609 into a gap between a number of ribbons 611 and a number of cell pieces 603. After soldering, an assembly 601 is formed. The assembly 601 comprises cell pieces 603, a top ribbon 611, and a bottom ribbon 607. Liquid insulator 609 sprayed by nozzles 610 into the gaps 608. The gaps 608 are located between the cell pieces 603, the top ribbon 611 and the bottom ribbon 607. The insulator 609 can be any polymer material including silicone, EVA or any other insulator materials. The drying or curing can be done by varying of process including heat, ultraviolet, infrared, or any other drying or curing method known in the art.

The assembled cells can be connected into a string in a series to make a solar panel as shown. One option is to manufacture the top and the bottom ribbon to jut, stick or protrude out on the assembly end. Then, the method performs the soldering of the "ribbon to cell" and the "ribbon to ribbon" simultaneously.

Figure 7:
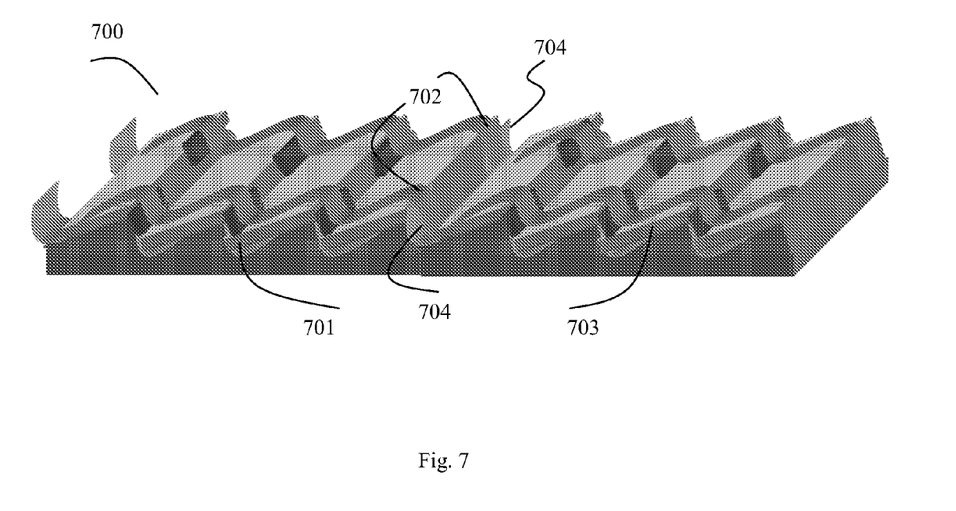
FIG. 7 shows the simplified side view of soldering an assembly cells into a string.

FIG. 7 shows a simplified side view of the cells into a string 700. The extension of the top ribbon 702 of one assembly cell 701 overlaps with the extension of the bottom ribbon 704 of an adjacent assembly cell 703. The soldering can be performed so that "ribbon to cell" and the "ribbon to ribbon" soldering is performed substantially simultaneously. By repeating the process on multiple cells, a string of solar cells 700 is formed.

Generally, in operation, the computer system operable with that method shown can be accomplished in a computerized fashion and can be controlled by an operating system. Typical examples of operating systems are MS-DOS, Windows 95, 98, 2000, XP, Vista and Windows 7 from Microsoft Corporation, or Solaris and SunOS from Sun Microsystems, Inc., UNIX based operating systems, LINUX based operating systems, or the Apple OSX from Apple Corporation. As the computer system operates, input such as input search data, database record data, programs and commands, received from users or other processing systems, are stored on storage device. Certain commands cause the processor to retrieve and execute the stored programs. The programs executing on the processor may obtain more data from the same or a different input device, such as a network connection. The programs may also access data in a database for example, and commands and other input data may cause the processor to index, search and perform other operations on the database in relation to other input data. Data may be generated which is sent to the output device for display to the user or for transmission to another computer system or device. Typical examples of the computer system are personal computers and workstations, hand-held computers, dedicated computers designed for a specific purpose, and large main frame computers suited for use many users. The present disclosure is not limited to being implemented on any specific type of computer system or data processing device.

It is noted that the present disclosure may also be implemented in hardware or circuitry which embodies the logic and processing disclosed herein, or alternatively, the present disclosure may be implemented in software in the form of a computer program stored on a computer readable medium such as a storage device. In the later case, the present disclosure in the form of computer program logic and executable instructions is read and executed by the processor and instructs the computer system to perform the functionality disclosed as the disclosure herein. If the present disclosure is embodied as a computer program, the computer program logic is not limited to being implemented in any specific programming language. For example, commonly used programming languages such as C, C++, JAVA as well as others may be used to implement the logic and functionality of the present disclosure. Furthermore, the subject matter of the present disclosure is not limited to currently existing computer processing devices or programming languages, but rather, is meant to be able to be implemented in many different types of environments in both hardware and software.

Furthermore, combinations of embodiments of the disclosure may be divided into specific functions and implemented on different individual computer processing devices and systems which may be interconnected to communicate and interact with each other. Dividing up the functionality of the disclosure between several different computers is meant to be covered within the scope of the disclosure.

While this disclosure has been particularly shown and described with references to a preferred embodiment thereof, it will be understood by those skilled in the art that is made therein without departing from the spirit and scope of the disclosure as defined by the following claims.

What is claimed is:

1. A method of forming a string of solar cells comprising: providing a scribe line on a solar cell; placing a first ribbon on the solar cell; placing the solar cell on a supporter; breaking the solar cell into a plurality of solar cell pieces; placing a second ribbon on the solar cell pieces; solder the first and second ribbons and the solar cell pieces; and assembling the solar cell pieces into the string of solar cells.

2. The method of claim 1, further comprising providing at least two scribe lines on the solar cell across a lateral side of the solar cell.

3. The method of claim 1, further comprising placing the solar cell on the supporter, wherein the supporter comprises a first member having a plurality of inclined second members, the plurality of second members being angled and extending from a top side of the first member.

4. The method of claim 1, further comprising placing the first ribbon on the solar cell by placing the first ribbon on the supporter and then placing the solar cell on the first ribbon and on the supporter.

5. The method of claim 3, further comprising placing the solar cell face down on the supporter, wherein the scribe line is generally aligned with the plurality of second members.

6. The method of claim 5, further comprising breaking the solar cell into the plurality of solar cell pieces by imparting a force on the scribe line to break the solar cell.

7. The method of claim 6, further comprising imparting the force on the scribe line to break the solar cell using a roller bar.

8. The method of claim 1, further comprising introducing an insulator onto at least one ribbon and between the cell pieces.

9. The method of claim 1, further comprising providing more than two scribe lines on the solar cell.

* * * * *